(12) United States Patent
Lohninger et al.

(10) Patent No.: US 9,103,902 B2
(45) Date of Patent: Aug. 11, 2015

(54) PACKAGED ANTENNA AND METHOD FOR PRODUCING SAME

(75) Inventors: Gerhard Lohninger, Munich (DE); Johann P. Forstner, Steinhoering (DE); Rudolf Lachner, Ingolstadt (DE)

(73) Assignee: Infineon Technologies AG, Neubiberg (DE)

( * ) Notice: Subject to any disclaimer, the term of this patent is extended or adjusted under 35 U.S.C. 154(b) by 1613 days.

(21) Appl. No.: 11/746,480

(22) Filed: May 9, 2007

(65) Prior Publication Data

US 2008/0278400 A1   Nov. 13, 2008

(51) Int. Cl.
| | |
|---|---|
| *H01Q 1/38* | (2006.01) |
| *H01Q 1/40* | (2006.01) |
| *H01Q 9/28* | (2006.01) |
| *G01S 7/03* | (2006.01) |
| *H01Q 23/00* | (2006.01) |

(52) U.S. Cl.
CPC .. *G01S 7/03* (2013.01); *H01Q 1/38* (2013.01); *H01Q 9/285* (2013.01); *H01Q 23/00* (2013.01)
USPC .................................. 343/700 MS; 343/873

(58) Field of Classification Search
USPC ........................... 343/700 MS, 872, 873, 878
See application file for complete search history.

(56) References Cited

U.S. PATENT DOCUMENTS

| | | | | |
|---|---|---|---|---|
| 5,903,239 | A * | 5/1999 | Takahashi et al. ...... | 343/700 MS |
| 6,061,026 | A * | 5/2000 | Ochi et al. ............. | 343/700 MS |
| 6,137,434 | A | 10/2000 | Tohya et al. | |
| 6,140,689 | A | 10/2000 | Scheiter et al. | |
| 6,770,955 | B1 | 8/2004 | Coccioli et al. | |
| 6,992,636 | B2 * | 1/2006 | Tebbe et al. ............. | 343/700 MS |
| 7,179,699 | B2 * | 2/2007 | Miyairi et al. ................. | 438/166 |
| 7,248,222 | B2 * | 7/2007 | Iijima et al. ............. | 343/700 MS |
| 7,605,450 | B2 * | 10/2009 | Bromberger ................... | 257/664 |
| 7,709,354 | B2 * | 5/2010 | Stowe et al. .................... | 438/459 |
| 2002/0011947 | A1 | 1/2002 | Stolarczyk et al. | |
| 2002/0149520 | A1 * | 10/2002 | Laubner et al. ......... | 343/700 MS |
| 2004/0016094 | A1 * | 1/2004 | Schaper ......................... | 29/25.42 |
| 2004/0198253 | A1 * | 10/2004 | Kondo et al. .................... | 455/91 |
| 2005/0035924 | A1 * | 2/2005 | Liu et al. ......................... | 343/895 |
| 2005/0104778 | A1 * | 5/2005 | Choi et al. ............. | 343/700 MS |

(Continued)

FOREIGN PATENT DOCUMENTS

| | | |
|---|---|---|
| DE | 196 48 424 C1 | 6/1998 |
| DE | 10 2004 046 634 | 3/2006 |

(Continued)

OTHER PUBLICATIONS

Hao Li et al.; "Fully Integrated SiGe VCOs With Powerful Output Buffer for 77-GHz Automotive Radar Systems and Applications Around 100 GHz"; IEEE Journal of Solid-State Circuits, vol. 39, No. 10, Oct. 2004, pp. 1650-1658.

(Continued)

*Primary Examiner* — Trinh Dinh
(74) *Attorney, Agent, or Firm* — Schiff Hardin LLP

(57) ABSTRACT

Electronic apparatus having an antenna chip with a substrate and an antenna structure, and a method of producing the same. The antenna chip is integrated or packaged in a package having a clip mounting surface for mounting the antenna chip, and an encapsulating material. The encapsulating material typically is a plastic mold used in the industrial packaging of integrated circuits. Between the antenna structure and the chip mounting surface, a first void is disposed in the substrate.

45 Claims, 5 Drawing Sheets

(56) References Cited

U.S. PATENT DOCUMENTS

| | | |
|---|---|---|
| 2005/0236670 A1* | 10/2005 | Chien et al. .................. 257/347 |
| 2005/0238277 A1* | 10/2005 | Wang et al. ...................... 385/8 |
| 2006/0220816 A1* | 10/2006 | Scheungraber et al. ...... 340/447 |
| 2006/0223577 A1 | 10/2006 | Ouzillou |
| 2006/0276157 A1 | 12/2006 | Chen |
| 2007/0063056 A1 | 3/2007 | Gaucher |
| 2007/0114889 A1* | 5/2007 | Cobianu et al. .............. 310/338 |
| 2008/0238792 A1* | 10/2008 | Heinrich et al. ............. 343/767 |
| 2008/0251912 A1* | 10/2008 | Otremba et al. ............. 257/723 |
| 2009/0100764 A1* | 4/2009 | Wang et al. .................... 51/298 |

FOREIGN PATENT DOCUMENTS

| | | |
|---|---|---|
| EP | 0 884 799 A2 | 12/1998 |
| WO | WO-2005/109330 A1 | 11/2005 |

OTHER PUBLICATIONS

Mario Engl; "Package Characterization Techniques and Evaluation of a Plastic package for mm-Wave Applications"; Doctoral Thesis, Erlangen, Germany, 2006—(please use the following link: http://www.opus.ub.uni-erlangen.de/opus/volltexte/2006/351/pdf/MarioEnolDissertation.pdf).

* cited by examiner

PACKAGED ANTENNA AND METHOD FOR PRODUCING SAME

BACKGROUND

The present invention generally relates to apparatus and methods for packaging antenna devices and, in particular, apparatus and methods for packaging antenna chips to thereby form compact integrated radar, radio or wireless communications systems for high frequency applications.

Antenna structures are used in a variety of applications. Communication devices are equipped with antennas to enable wireless communication between devices in network systems such as wireless PAN (personal area network), wireless LAN (local area network), wireless WAN (wide area network), cellular network systems, and other types of radio systems.

Further applications include radar sensors, for example in the frequency range between 76 GHz and 81 GHz, which have gained importance in a variety of technical fields like automotive technology (collision avoidance, pre crash safety, etc.), motion sensing in households and the like.

With conventional radar, radio or wireless communications systems, discrete components are individually encapsulated or individually mounted with low integration levels on printed circuit boards, packages or substrates. This usually causes significant losses at those high operating frequencies. At the same time, the miniaturization of the systems becomes more important, as robustness and reliability are required in the respective environments. Accordingly, there is a desire to package these electronic devices more densely. This, however, poses a number of challenges to designers, as high frequency appliances have to be integrated in hermetically closed packages while at the same time minimizing degrading effects on the emission characteristics and efficiency of the applied antennas.

Hence, there is a need for a technology to integrate antenna structures into a package and to improve the emission behavior of a radar antenna structures which are encapsulated in a package.

BRIEF DESCRIPTION OF THE FIGURES

Embodiments of the invention will be described below with reference to exemplary embodiments which are shown in the appended figures. However, the invention is not restricted to the specifically described exemplary embodiments but rather may be modified and varied in a suitable manner. It is within the scope of the invention to combine individual features and combinations of features of one exemplary embodiment with features and combinations of features of another exemplary embodiment.

DETAILED DESCRIPTION OF THE INVENTION

A first aspect of the present invention provides an electronic apparatus which includes an antenna chip or a chip that accommodates an antenna as well as other active and passive circuitries. The chip includes a substrate and an antenna structure. The apparatus further includes a package having a chip mounting surface and an encapsulating material. A first void is arranged in the substrate in the vicinity of the antenna structure.

In a second aspect of the present invention, an electronic apparatus is provided, which includes an antenna chip having a substrate and an antenna structure with optional active/passive circuitries. The apparatus further includes a package which includes a chip mounting surface and an encapsulating material, and a cap covering the antenna structure. A second void is arranged between the antenna structure and the cap.

A third aspect of the present invention provides a method of producing an electronic apparatus comprising an antenna chip and a package. The method includes the steps of providing a substrate, producing an antenna structure on an upper face of the substrate, producing a first void in the substrate, disposing the substrate on a chip mounting surface of the package, and providing a encapsulating material to seal the package.

In a fourth aspect of the present invention, there is provided a method of producing an electronic apparatus comprising an antenna chip and a package. The method includes the steps of providing a substrate, producing an antenna structure on an upper face of the substrate, disposing a cap on the upper face of the substrate covering the antenna structure, disposing the substrate on a chip mounting surface of the package, and providing a encapsulating material to seal the package.

As a result of the use of an electronic apparatus with an antenna structure having one or more voids disposed in its vicinity, the emission characteristics of the antenna is improved.

In order to simplify understanding of the description, identical reference numbers are used below when identical elements which are used together in the figures are involved. Elements in one embodiment may also be used in another embodiment without this being individually mentioned in each case.

Figure 1:
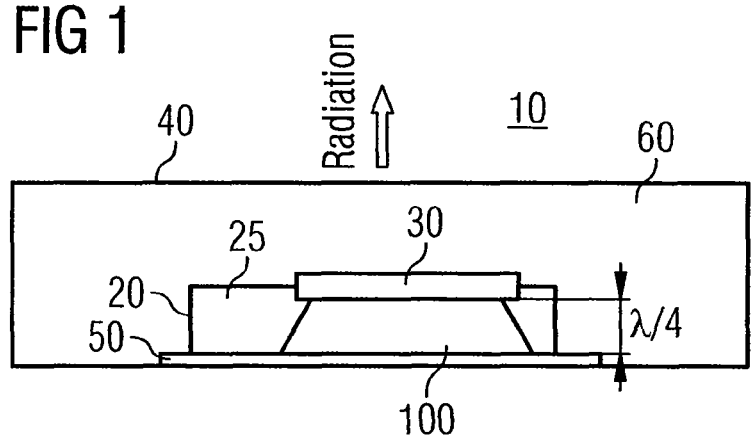
FIG. 1 shows a sectional view of a first embodiment of the present invention.

FIG. 1 shows a first embodiment of the present invention. FIG. 1 shows an electronic apparatus 10 having an antenna chip 20 with a substrate 25 and an antenna structure 30. The antenna chip 20 is integrated or packaged in a package 40 having a conducting chip mounting surface 50 for mounting the antenna chip, and an encapsulating material 60. The encapsulating material may be, but is not limited to a typical plastic mold used in the industrial packaging of integrated circuits. Between the antenna structure 30 and the chip mounting surface 50, a first void 100 is arranged in the substrate 25 in the vicinity of the antenna structure 30, wherein the antenna structure 30 covers the first void. The substrate height may be adjusted to the individual operating wavelength. Preferably, substrate height is a quarter of the operating wavelength to support radiation in the direction of the front side of the antenna chip.

The antenna structure 30 may be formed of any suitable material or combination of materials including, for example, dielectric or isolative materials such as fused silica ($SiO_2$), silicon nitride, imides, pcb as supporting and/or embedding material and conducting materials like aluminium, copper, gold, titanium, tantalum and others or alloys of those conductors as active antenna materials. The antenna substrate 25 may be formed of semiconductor materials such as silicon, GaAs, InP, or GaN, especially if further circuit components are to be integrated into the antenna chip 20. Other types of substrate like glass, polystyrene, ceramics, Teflon® based materials, FR4 or similar materials are also included.

Figure 2:
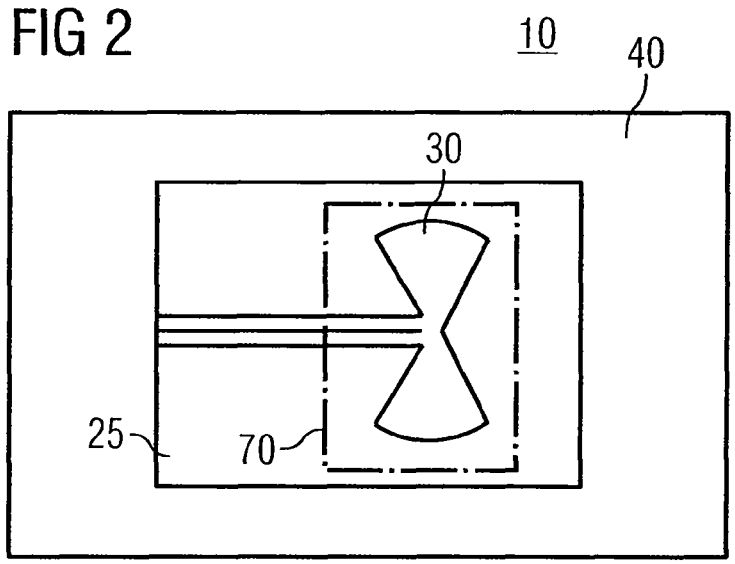
FIG. 2 shows a sectional top view of a first embodiment of the present invention.

FIG. 2 shows a top sectional view of the above described embodiment of the present invention. The shape of the antenna structure 30 should be regarded as an example and as non-limiting. The antenna structure 30 may take the form of a variety of antenna types like Patch, Folded Dipole, Butterfly, Leaky wave, etc.

The present invention thus relates to the practice of disposing at least one void adjacent to an antenna structure. This significantly improves the emission and/or receiving characteristics of the antenna and thus allows reducing the applied power to achieve a certain radiated power or in case of receiving allows for a improved signal to noise figure. At the same time, homogeneity of the field distant from the antenna is improved. Furthermore, the electronic apparatus 10 allows for a dense package of the antenna structure which leads to the further miniaturization of the overall systems which use the antenna structure. Despite the dense package the emission and/or receiving characteristics of the antenna is improved and the mechanical robustness and reliability of the antenna structure can be guaranteed.

In an embodiment of the invention, the first void 100 is produced by etching the substrate 25 under the antenna structure 30. In case of silicon substrates the first void is preferably formed by a bulk etching process from a bottom surface of the substrate opposite to the antenna structure. The silicon bulk etching process can be performed by using a TMAH of KOH wet etch process or a plasma etching to etch off the bulk silicon.

The first void 100 typically has a size similar or larger to that of the antenna structure 30. Preferably, when the shape of the first void is projected vertically on the antenna structure, it is about ¹/₁₀ larger than the largest dimension of the antenna. Voids which are significantly larger than the antenna structure may also be used. The void may also be segmented, e.g. to improve mechanical stability of the assembly.

Figure 5:
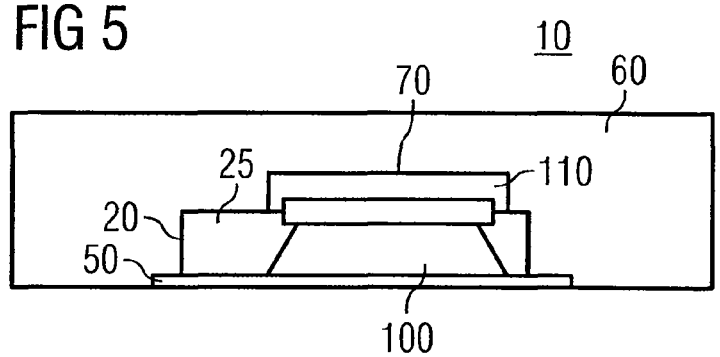
FIG. 5 shows a sectional view of another embodiment of the present invention.

In a further embodiment of the invention shown in FIG. 5, the electronic apparatus further comprises a second void 110 disposed between the antenna structure 30 and the encapsulating material 60. The second void serves to improve the emission characteristics of the antenna, as without a void the encapsulating material or mold would be in direct contact with the antenna structure, which might worsen the emission/receiving characteristics.

There are a variety of options to realize a second void. In an embodiment of the present invention, an additional cap 70 is placed on the antenna structure 30 before the packaging of the apparatus, i.e. prior to the application of the encapsulating material 60 or mold mass. A suitable cap for this purpose is for example a SU8 frame. In a further embodiment of the present invention, the second void is realized by using the encapsulation material in the form of an encapsulating lid 65 (FIG. 7) that is not in direct contact with the antenna chip 30.

Figure 3:
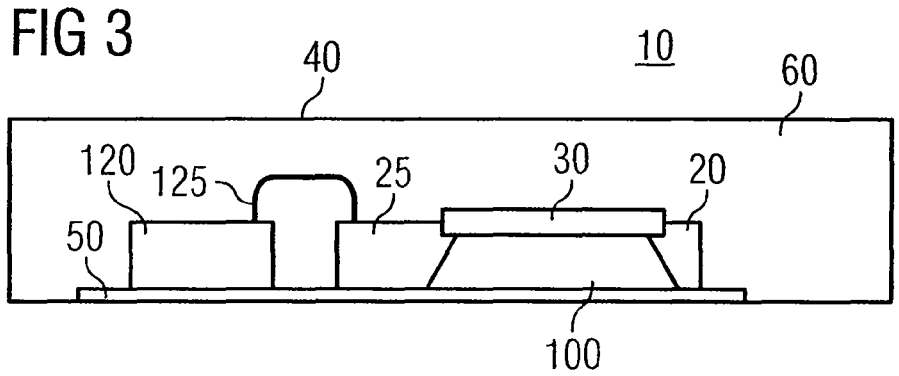
FIG. 3 shows a sectional view of another embodiment of the present invention comprising a circuit.

In another embodiment of the invention shown in FIG. 3, the electronic apparatus further comprises a high frequency circuit chip 120 mounted to the chip mounting surface 50 of the package 40. The circuit serves to provide signals to the antenna structure 30 and to receive signals from it. It may comprise further electronic parts and components necessary to realize a radar, radio or wireless communication system in combination with the antenna structure, i.e. oscillators, mixers, frequency dividers, etc.

In the embodiment shown in FIG. 3 the high frequency circuit chip 120 and the antenna chip 30 are connected via wirebonds interconnects 125. In a further embodiment of the present invention the high frequency circuit chip 120 and the antenna chip 30 are connected via bumps in a flip chip configuration. For example the filter circuit chip 120 might be placed upside down on top of the antenna chip 20 outside the area of the antenna structure 30. A combination of the antenna structure with active circuit blocks on one common chip shall be another embodiment.

Figure 4:
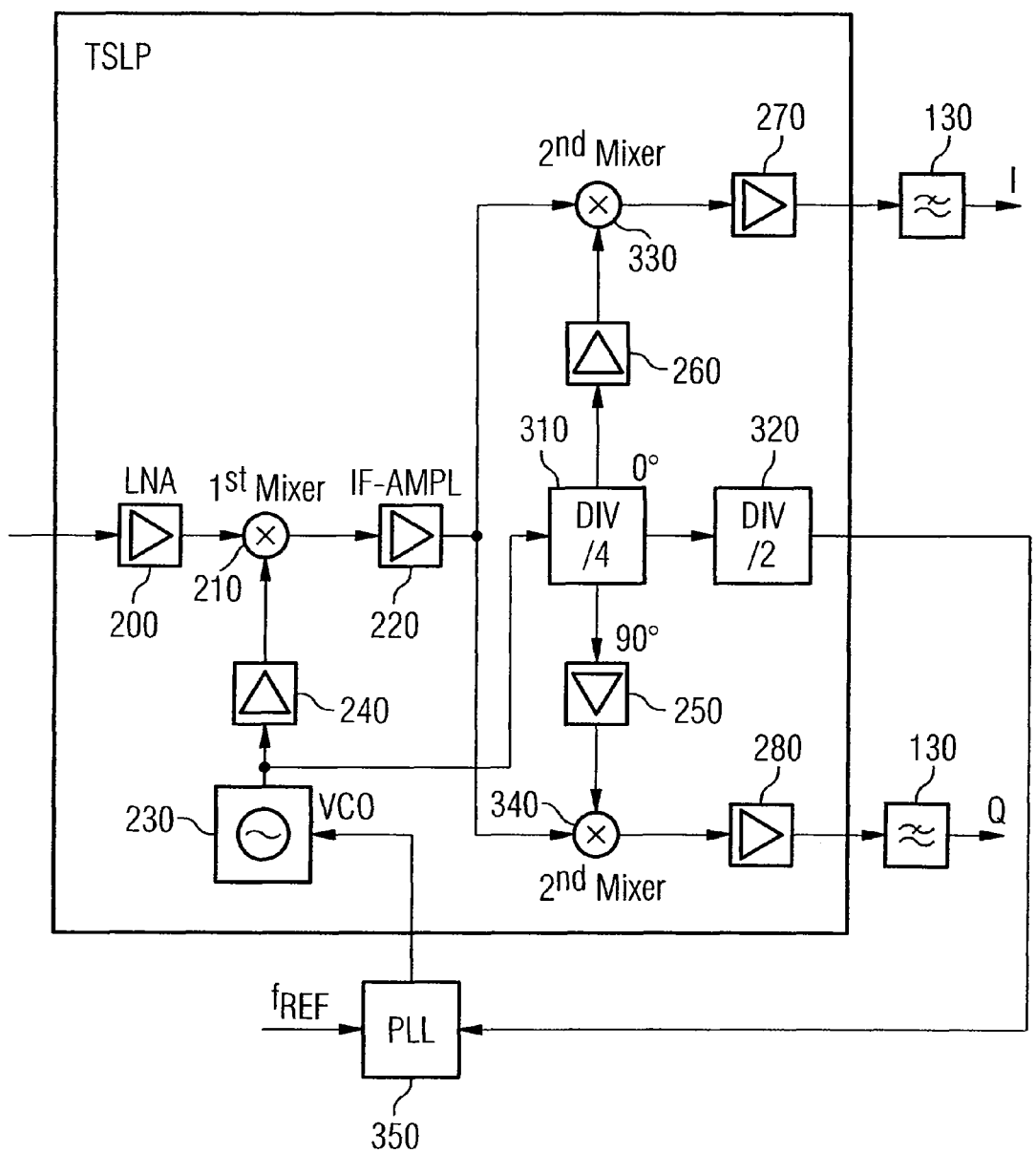
FIG. 4 shows a circuit diagram showing a part of a circuit according to an embodiment of the present invention.

FIG. 4 shows a circuit diagram of the receiver part of a communication circuit according to an embodiment of the invention. This circuit should be regarded as a non-limiting example. It comprises a Low-Noise-Amlifier (LNA) 200, a first mixer 210, an intermediate frequency amplifier 220, a voltage controlled oscillator 230, amplifiers 240, 250, 260, 270, 280, a first frequency divider 310, a second frequency divider 320, and two second mixers 330, 340. The circuit is connected to an external phase locked loop 350.

The circuit 120 may be accompanied by an additional resonator chip 130 to filter the received signals, which can for example be a bulk acoustic wave filter or a DR filter etc.

In order to achieve a high level of integration of the electronic components on circuit 120, it is preferably, but not necessarily realized in SiGe-technology.

Furthermore, the present invention may also be employed in connection with radar sensors. Due to the small wavelengths occurring in the target operation frequency range of about 76 to 81 GHz, very small antennas can be used in the present invention. A typical antenna area is smaller than 2 $mm^2$.

In a further embodiment of the invention, the circuit 120 and the antenna chip 20 are integrated on a single chip using a single substrate, which can contribute to further miniaturize the electronic apparatus and to reduce production costs. However, depending on technical requirements, chosen operating parameters and the like, it can be advantageous to employ separate chips for the antenna and the circuit as described above.

Figure 9:
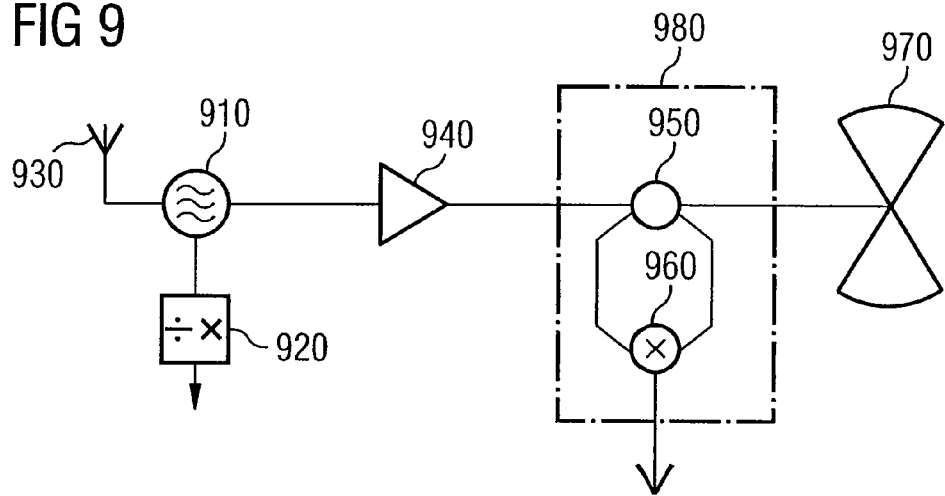
FIG. 9 shows a typical, simplified block diagram of a monostatic FMCW radar sensor used for the present invention.
Figure 12:
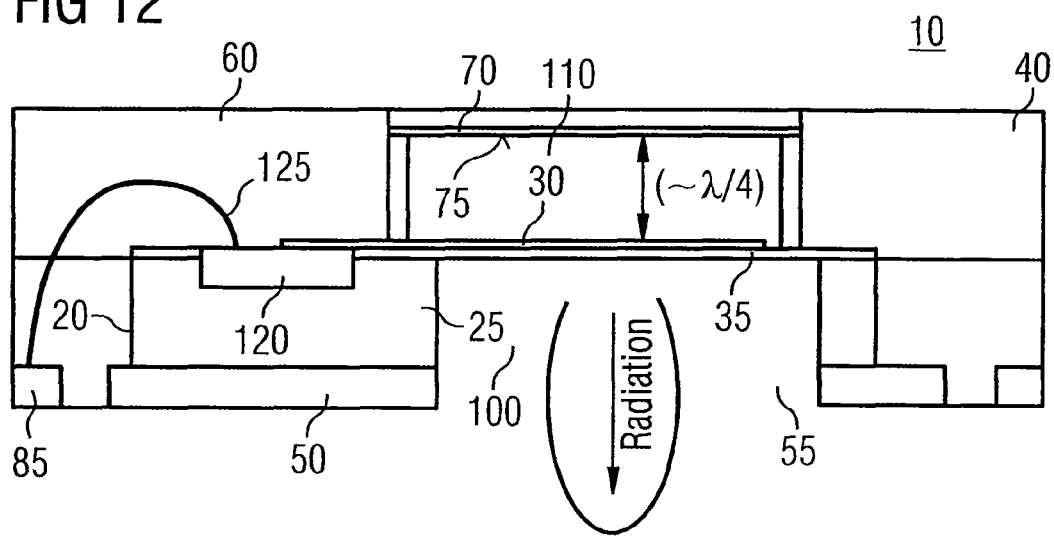
FIG. 12 shows a sectional view of further embodiment of the present invention.
Figure 13:
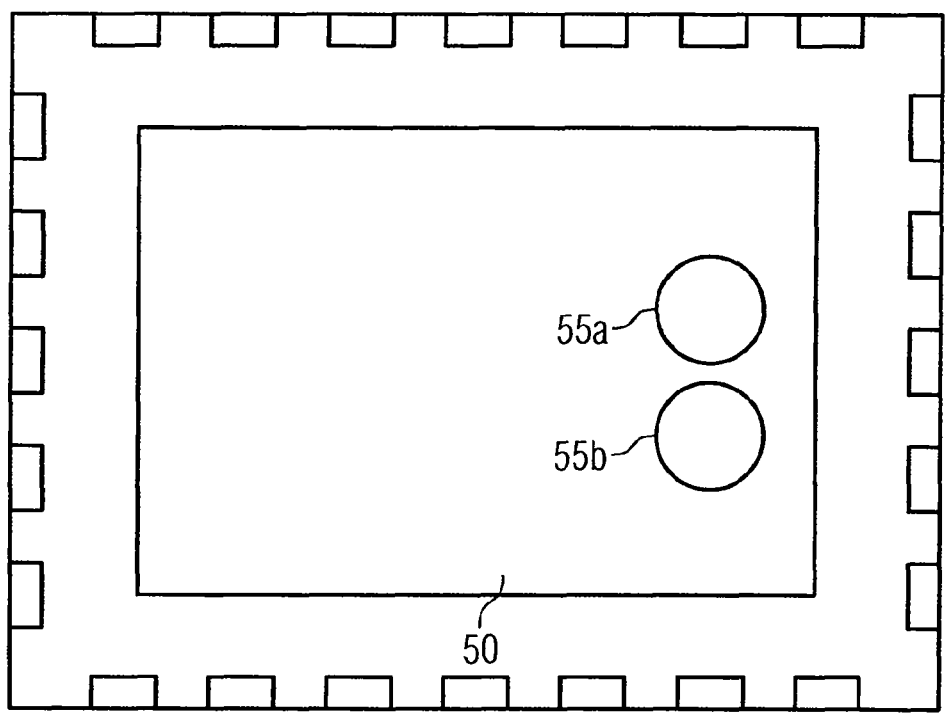
FIG. 13 shows a sectional top view of the embodiment shown in FIG. 12.

FIG. 9 shows a radar transmitting and receiving circuit integrated with antenna within one common Si substrate. The height and caps of the voids above and/or below the antenna can be adjusted to allow for preferred radiation and/or reception to the top surface or bottom surface of the structure (FIGS. 12, 13). In case of radiation/reception to the bottom openings in the chip carrier can be provided.

The antenna structure 30 of the present invention can be used to work as a radar antenna according to a variety of principles, which are continuous wave, continuous wave/Doppler, Frequency Modulated Continuous Wave (FMCW), and pulsed mode. Of those, continuous wave and continuous wave/Doppler are most common. The FMCW mode is suitable to detect the distance to a target object, whereas pulsed mode may be preferred if energy consumption of the sensor should be minimized.

Figure 6:
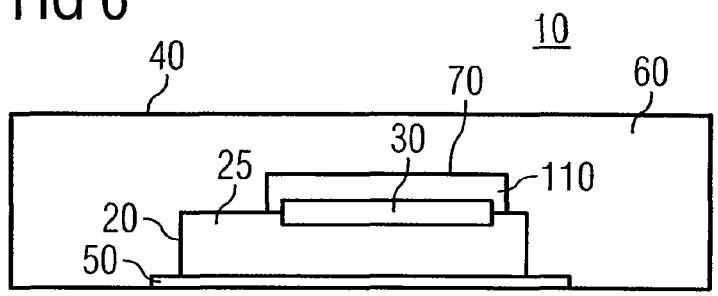
FIG. 6 shows a sectional view of another embodiment of the present invention.

FIG. 6 shows another embodiment of the present invention. FIG. 6 shows an electronic apparatus 10 having an antenna chip 20 with a substrate 25 and an antenna structure 30. The antenna chip 20 is integrated or packaged in a package 40 having a chip mounting surface 50 for mounting the antenna chip, and an encapsulating material 60. The encapsulating material may be, but is not limited to a typical plastic mold compound used in the industrial packaging of integrated circuits. Suitable mold compounds are for example CEL 9240 HF, EME G770I, EME G760D-F, KMC 2520L.

Figure 7:
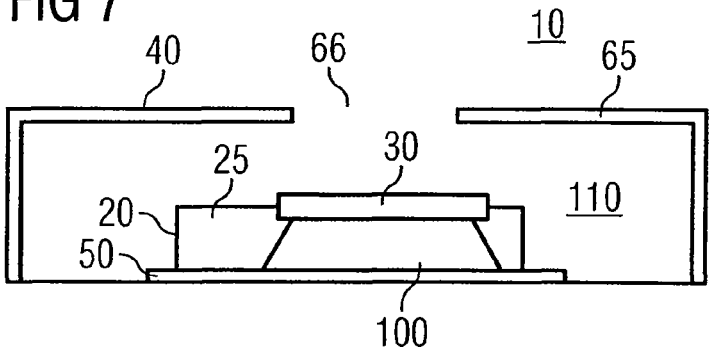
FIG. 7 shows a sectional view of further embodiment of the present invention.

As can be seen from FIG. 7 the encapsulating material may, as an alternative, also take the form of a lid 65, preferably a metal lid, having an opening 66 for radiating the signal power. As a further alternative the lid 65 does not comprise an opening 66 but, instead, chip mounting surface 50 comprises an opening adjacent to the void 100 in the antenna substrate 25 similar to the embodiment of the present invention shown in FIG. 12. Thereby, the distance between the antenna structure and the lid is preferably a quarter of the operating wavelength to support radiation in the direction of the back side of the antenna chip.

In case the encapsulating material is plastic mold compound (FIG. 6) a cap 70 is covering the antenna structure 30. A second void is disposed between the antenna structure 30 and the cap 70. The second void serves to improve the emission characteristics of the antenna, as without a void the mold material 60 would be in direct contact with the antenna structure, which might worsen the emission characteristics. This embodiment can be combined with other features according to the present invention as hereinbefore described with respect to other embodiments.

Due to the small size of the antenna structure 30, it is possible to design the electronic apparatus of the present invention with a very small volume of only a few mm$^3$. A preferred package for small electronic systems is the Thin Small Leadless Package (TSLP). Accordingly, in an embodiment of the invention the apparatus of the present invention comprises a TSLP package. A suitable TSLP package is available from Infineon Technologies, Munich, Germany. The height of the package is 0.4 mm, width 1.5 mm and length 2.3 mm.

The electronic apparatus of the present invention may be used in other frequency ranges and is not limited to the range from about 76 to 81 GHz as described.

Figure 8:
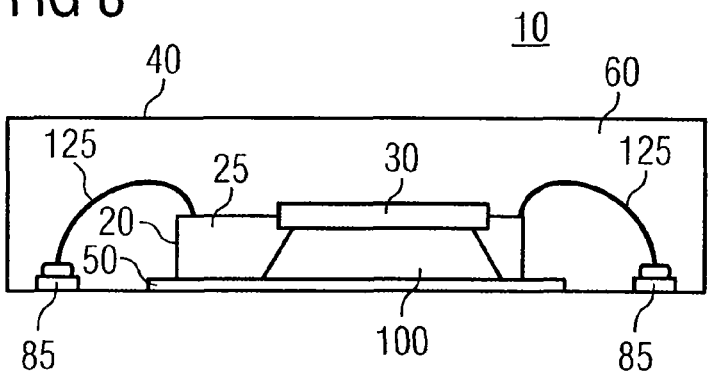
FIG. 8 shows a sectional view of still another embodiment of the present invention.

FIG. 8 shows another embodiment of the present invention using a Thin Small Leadless Package (TSLP). In order to connect the package 40 to a printed circuit board (not shown) the package 40 comprises land interconnects 85. The antenna chip 20 is directly connected to the contact lands 85 using wirebonds 125.

FIG. 9 shows a typical, simplified block diagram of a monostatic FMCW radar sensor. A VCO 910, which can be connected to an external PLL via a prescaler 920 and the tuning input 930, generates the frequency ramps. A buffer amplifier 940 amplifies the VCO output signal and isolates the VCO from the rest of the circuit. The amplified signal is fed to a directional coupler 950 that feeds a part of the signal to the antenna 970 where it is radiated and another part to the LO input of the mixer 960. The incoming signal is fed from the antenna 970 to the coupler 950, where a part is fed to the RF input of the mixer 960 where it is demodulated. In a simpler implementation, the transmit receive block 980 can also be a diode.

Figure 10:
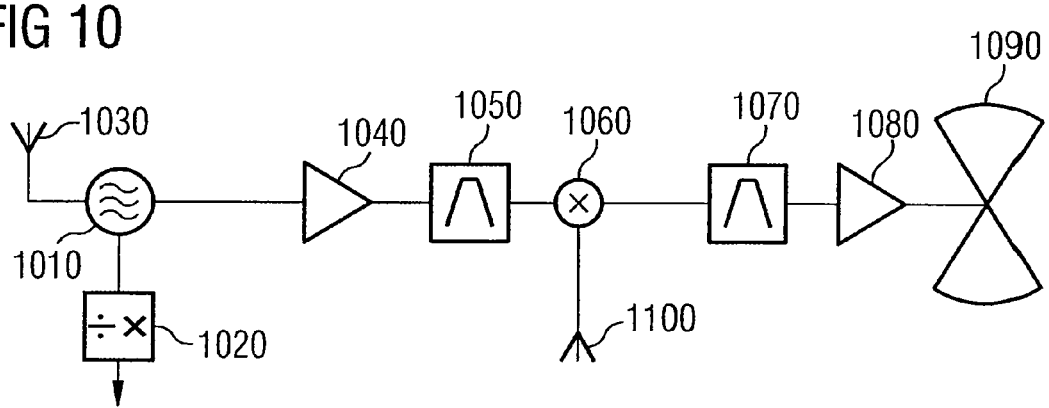
FIG. 10 shows a typical, simplified block diagram of a data transmitter used for the present invention.

FIG. 10 shows a typical, simplified block diagram of a data transmitter. A VCO 1010, which can be connected to an external PLL via a prescaler 1020 and the tuning input 1030, generates the LO signal. A buffer amplifier 1040 amplifies the VCO output signal and isolates the VCO from the rest of the circuit. Via an optional filter 1050, the LO signal is fed to the LO input to an up-conversion mixer 1060, where the LO signal is modulated with a data signal 1100. After filtering with a filter 1070 and amplification 1080 the RF signal is fed to the antenna, where it is radiated.

Figure 11:
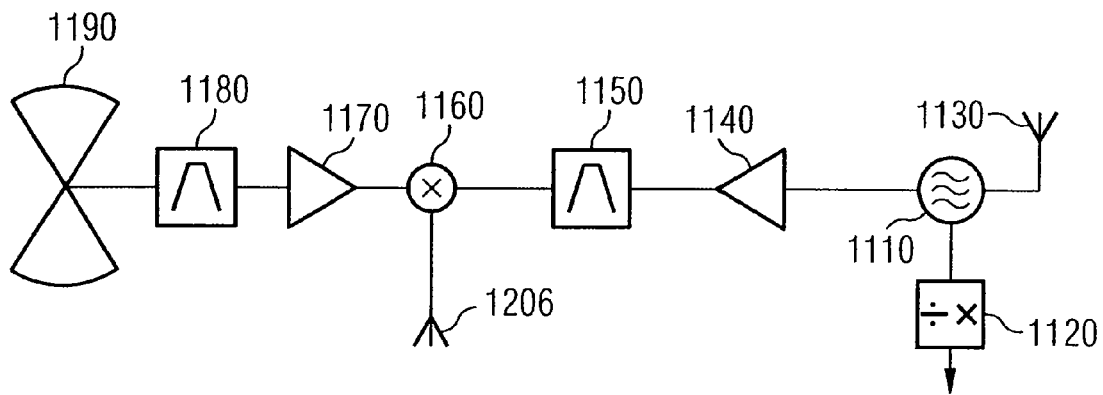
FIG. 11 shows a typical, simplified block diagram of a data receiver used for the present invention.

FIG. 11 shows a typical, simplified block diagram of a data receiver. A VCO 1110, which can be connected to an external PLL via a prescaler 1120 and the tuning input 1130, generates the LO signal. A buffer amplifier 1140 amplifies the VCO output signal and isolates the VCO from the rest of the circuit. Via an optional filter 1150, the LO signal is fed to the LO input to a down-conversion mixer 1160, where the via antenna 1190, filter 1180 and LNA 1170 incoming signal is demodulated.

A combination of FIG. 10 and FIG. 11 on one common chip is also possible. This can be done with two individual antennas located at opposite sides of the chip or by one common antenna which is connected by a switch or a duplex filter to the transmit and receive block.

FIG. 12 shows a further embodiment of the present invention. FIG. 12 shows an electronic apparatus 10 having an antenna chip 20 with a substrate 25 and an antenna structure 30. The antenna chip 20 is integrated or packaged in a package 40 having a conducting chip mounting surface 50 for mounting the antenna chip, and an encapsulating material 60. Below the antenna structure 30 a first void 100 is arranged in the substrate 25. In order to provide additional mechanical stability to the antenna structure 30, the antenna structure 30 is supported by a membrane 35 which separates the antenna structure 30 from the first void 100 in the substrate 25. Preferably, the membrane is made of non-conducting material, for example silicon oxide or silicon nitride. The membrane 35 may also comprises several layers of the same or different materials.

The electronic apparatus shown in FIG. 12 further comprises a second void 110 disposed between the antenna structure 30 and the encapsulating material 60. The second void 110 is provided by an additional cap 70 that is placed on the antenna structure 30 before the packaging of the apparatus, i.e. prior to the application of the mold mass 60. A suitable cap for this purpose is for example a SU8 frame that has been provided with conducting inner surface 75 to reflect the radiation emitted from the antenna structure 30. The height of the cap 70 may be adjusted to the individual operating wavelength. Preferably, height of the cap 70 is a quarter of the operating wavelength to support radiation in the direction of the back side of the antenna chip.

In order to allow the radiation to be emitted in the direction of the back side of the antenna chip the chip mounting surface 50 comprises openings 55 adjacent to the void 100 in the antenna substrate 25. FIG. 13 shows a corresponding sectional top view of the embodiment shown in FIG. 12. Thereby, antenna opening 55a in lead frame is used to transmit radiation from the antenna structure whereas antenna opening 55b in the lead frame is used to receive radiation.

In the embodiment of the invention shown in FIG. 12, the circuit 120 and the antenna chip 20 are integrated on a single chip using a single substrate, which can contribute to further miniaturize the electronic apparatus and to reduce production costs. Thereby, the circuit 120 is preferably a SiGe circuit.

The package shown in FIG. 12 is a Thin Small Leadless Package (TSLP). In order to connect the package 40 to a printed circuit board (not shown) the package 40 comprises land interconnects 85. The antenna chip 20 is directly connected to the contact lands 85 using wirebonds 125.

It is to be understood that the exemplary electronic apparatus depicted in FIGS. 1-13 above can be constructed using various types of chip fabrication and packaging technologies, and that the invention is not limited to any specific chip fabrication and packaging technologies discussed herein.

What is claimed is:

1. An electronic apparatus, comprising:
    a chip package comprising a conducting chip mounting surface and an encapsulating material:
    an antenna chip comprising a silicon substrate and an antenna structure, wherein a back side of the antenna chip is mounted on the conducting chip mounting surface; and
    a first void arranged in the substrate in the vicinity of the antenna structure, wherein the antenna structure covers the first void at a front side of the antenna chip and is configured to provide radiation in the direction of the front side of the chip.

2. The apparatus of claim 1, wherein the first void is produced by etching.

3. The apparatus of claim 1, wherein a vertical projection of the first void onto the antenna structure has substantially the same largest diameter as the largest diameter of the antenna structure or a larger diameter than the largest diameter of the antenna structure.

4. The apparatus of claim 1, further comprising a second void is arranged between the antenna structure and the encapsulating material.

5. The apparatus of claim 1, further comprising a high frequency circuit.

6. The apparatus of claim 5, further comprising a high frequency circuit chip.

7. The apparatus of claim 6, wherein the high frequency circuit chip and the antenna chip are connected via interconnects selected from the group of interconnects consisting of wirebonds and bumps.

8. The apparatus of claim 6, wherein the high frequency circuit chip is based on SiGe-technology.

9. The apparatus of claim 6, wherein the high frequency circuit chip and the antenna chip are both mounted on the conducting chip mounting surface.

10. The apparatus of claim 1, further comprising a filter chip.

11. The apparatus of claim 10, wherein the filter chip and the antenna chip are connected via interconnects selected from the group of interconnects consisting of wirebonds and bumps.

12. The apparatus of claim 1, wherein the apparatus is a radar sensor following at least one principle selected from the group of principles consisting of continuous wave, continuous wave/Doppler, Frequency Modulated Continuous Wave (FMCW), and pulsed mode.

13. The apparatus of claim 1, wherein the antenna structure has a size smaller than 2 mm$^2$.

14. The apparatus of claim 1, wherein the encapsulating material is a mold compound or functions as a lid.

15. The apparatus of claim 14, wherein the encapsulating material functions as a lid comprising an opening.

16. The apparatus of claim 1, wherein the chip mounting surface comprises an opening adjacent to the void in the substrate.

17. The apparatus of claim 1, wherein the void comprises segments.

18. The apparatus of claim 1, wherein a distance between the antenna structure and the chip mounting surface is a quarter of a wavelength.

19. The apparatus of claim 1, wherein the chip package comprises a lead-frame, wherein a surface of the lead-frame is the conducting chip mounting surface.

20. The apparatus of claim 1, wherein the silicon substrate has a height configured to support radiation in the direction of the front side of the chip.

21. The apparatus of claim 20, wherein the height is approximately a quarter wavelength of a radiated signal.

22. The apparatus of claim 1, wherein the conducting chip mounting surface is configured to mount the chip.

23. An electronic apparatus, comprising:
    a chip package comprising a conducting chip mounting surface and an encapsulating material;
    an antenna chip comprising a silicon substrate and an antenna structure, wherein a back side of the antenna chip is mounted on the conducting chip mounting surface;
    a cap covering the antenna structure;
    a first void disposed between the antenna structure and the cap; and
    a second void arranged in the substrate between the antenna structure and the chip mounting surface, wherein the antenna structure covers the second void at a front side of the antenna chip and is configured to provide radiation in the direction of the front side of the chip.

24. The apparatus of claim 23, wherein a vertical projection of the first void onto the antenna structure has substantially the same largest diameter as the largest diameter of the antenna structure or a larger diameter than the largest diameter of the antenna structure.

25. The apparatus of claim 23, wherein the second void is produced by etching.

26. The apparatus of claim 23, further comprising a high frequency circuit.

27. The apparatus of claim 26, further comprising a high frequency circuit chip.

28. The apparatus of claim 27, wherein the high frequency circuit chip and the antenna chip are connected via interconnects chosen from the group of interconnects consisting of wirebonds and bumps.

29. The apparatus of claim 27, wherein the high frequency circuit chip and the antenna chip are both mounted on the conducting chip mounting surface.

30. The apparatus of claim 27, wherein the high frequency circuit chip is based on SiGe-technology.

31. The apparatus of claim 23, further comprising a filter chip.

32. The apparatus of claim 31, wherein the filter circuit chip and the antenna chip are connected via interconnects chosen from the group consisting of wirebonds and bumps.

33. The apparatus of claim 23, wherein the antenna structure has a size smaller than 2 mm$^2$.

34. The apparatus of claim 23, wherein the apparatus works as a radar sensor following at least one principle selected from the group of principles consisting of continuous wave, continuous wave/Doppler, Frequency Modulated Continuous Wave (FMCW), and pulsed mode.

35. The apparatus of claim 23, wherein the chip mounting surface comprises an opening adjacent to the antenna structure.

36. The apparatus of claim 23, wherein the cap comprises a conducting inner surface.

37. A method of producing an electronic apparatus comprising an antenna chip and a chip package, comprising:

a) providing a silicon substrate of the antenna chip;
b) producing an antenna structure of the antenna chip on an upper face of the substrate;
c) producing a first void in the substrate in the vicinity of the antenna structure, wherein the antenna structure covers the first void at a front side of the antenna chip and is configured to provide radiation in the direction of the front side of the antenna chip;
d) disposing the antenna chip on the chip mounting surface of the chip package, wherein a back side of the antenna chip is mounted on the conducting chip mounting surface; and
e) providing an encapsulating material of the package to seal the antenna chip.

38. The method of claim 37, wherein the first void in the substrate is produced by etching the substrate.

39. The method of claim 38, wherein the substrate is etched until the void extends through the substrate to the antenna structure.

40. The method of claim 37, further comprising after step c):
  c2) disposing a cap on the upper face of the substrate, wherein the size and shape of the cap is chosen to completely cover the antenna structure.

41. The method of claim 37, further comprising before step d):
  d2) connecting the antenna chip to contacts of the package.

42. The method of claim 41, wherein step d2) is carried out using flip-chip technology.

43. The method of claim 41, wherein step d2) is carried out by applying wire-bonding.

44. The method of claim 37, wherein the package is a Thin Small Leadless Package (TSLP).

45. The method of claim 37, wherein the antenna structure comprises aluminum.

* * * * *